(12) United States Patent
Kramer et al.

(10) Patent No.: US 8,358,534 B2
(45) Date of Patent: Jan. 22, 2013

(54) SPIN TORQUE TRANSFER MEMORY CELL STRUCTURES AND METHODS

(75) Inventors: Stephen J. Kramer, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 12/885,012

(22) Filed: Sep. 17, 2010

(65) Prior Publication Data

US 2012/0069646 A1    Mar. 22, 2012

(51) Int. Cl.
*G11C 11/15* (2006.01)
(52) U.S. Cl. ........ 365/171; 365/173; 365/158; 365/145; 257/295
(58) Field of Classification Search .................. 365/171, 365/173, 158, 145
See application file for complete search history.

(56) References Cited

U.S. PATENT DOCUMENTS

| | | | |
|---|---|---|---|
| 6,156,611 A | 12/2000 | Lan et al. | |
| 7,006,375 B2 | 2/2006 | Covington | |
| 7,598,579 B2 | 10/2009 | Horng et al. | |
| 7,709,885 B2 | 5/2010 | Daley et al. | |
| 7,742,328 B2 * | 6/2010 | Chen et al. | 365/158 |
| 2005/0045913 A1 * | 3/2005 | Nguyen et al. | 257/200 |
| 2005/0047198 A1 | 3/2005 | Engel et al. | |
| 2005/0199927 A1 * | 9/2005 | Lu | 257/295 |
| 2007/0285974 A1 * | 12/2007 | Takemura et al. | 365/158 |
| 2007/0296406 A1 * | 12/2007 | Shin et al. | 324/207.21 |
| 2008/0253174 A1 | 10/2008 | Yoshikawa et al. | |
| 2008/0310213 A1 * | 12/2008 | Chen et al. | 365/158 |
| 2009/0027810 A1 | 1/2009 | Horng et al. | |
| 2009/0096042 A1 | 4/2009 | Rizzo et al. | |
| 2009/0121266 A1 | 5/2009 | Pietambaram et al. | |
| 2009/0196818 A1 * | 8/2009 | Tokura et al. | 423/594.1 |
| 2009/0256220 A1 | 10/2009 | Horng et al. | |
| 2009/0279353 A1 * | 11/2009 | Worledge | 365/171 |
| 2009/0303779 A1 | 12/2009 | Chen et al. | |
| 2010/0065935 A1 | 3/2010 | Horng et al. | |
| 2010/0080048 A1 * | 4/2010 | Liu et al. | 365/157 |
| 2010/0103730 A1 | 4/2010 | Shin | |
| 2010/0110783 A1 | 5/2010 | Liu et al. | |
| 2010/0193888 A1 | 8/2010 | Gu et al. | |

(Continued)

FOREIGN PATENT DOCUMENTS

| EP | 2328194 A1 * | 6/2011 |
|---|---|---|
| JP | 2010-098259 A | 4/2010 |

(Continued)

OTHER PUBLICATIONS

Bea et al., Spintronics with Multiferroics, Oct. 9, 2008, Journal of Physics Condensed Matter, 20, 434221.*

(Continued)

*Primary Examiner* — Hoai V Ho
*Assistant Examiner* — Jay Radke
(74) *Attorney, Agent, or Firm* — Brooks, Cameron & Huebsch, PLLC

(57) ABSTRACT

Spin Torque Transfer (STT) memory cell structures and methods are described herein. One or more STT memory cell structures include a tunneling barrier material positioned between a ferromagnetic storage material and a pinned ferromagnetic material in contact with an antiferromagnetic material and a multiferroic material in contact with the ferromagnetic storage material, wherein the antiferromagnetic material, the ferromagnetic storage material, and the pinned ferromagnetic material are located between a first electrode and a second electrode.

26 Claims, 13 Drawing Sheets

U.S. PATENT DOCUMENTS

2010/0220516 A1 9/2010 Lee et al.
2011/0134689 A1* 6/2011 Hayakawa .................. 365/171

FOREIGN PATENT DOCUMENTS

| WO | 2007099277 A1 | 9/2007 |
| WO | 2009010595 A1 | 1/2009 |
| WO | 2010/032574 A1 | 3/2010 |
| WO | WO 2010/032574 A1 * | 3/2010 |
| WO | 2010-039424 A1 | 4/2010 |

OTHER PUBLICATIONS

Chu et al., Electric-field Control of Local Ferromagnetism Using a Magnetoelectric Multiferroic, Nature Materials, vol. 7, pp. 478-482.*

Bea et al., Combining Half-metals and Multiferroics into Epitaxial Heterostructures for Spintronics, Feb. 6, 2006, Applied Physics Letters, 88, 062502.*

Chu et al., "Electric-field Control of Local Ferromagnetism Using a Magnetoelectric Multiferroic", Jun. 2008 (published online Apr. 27, 2008), Nature Materials, vol. 7, pp. 478-482.*

T. Zhao, et al. "Electrical control of antiferromagnetic domain in multiferroic BiFeO3 films at room temperature", Nature Materials, vol. 5, Oct. 2006, www.nature.com/naturematerials (7 pgs.).

F. Zavaliche, et al. "Multiferroic BiFeO3 films: domain structure and polarization dynamics", Phase Transitions. vol. 79, No. 12, Dec. 2006, 991-1017, http://www.tandf.co.uk/journals (27 pgs.).

Manuel Bibes, et al. "Multiferroics Towards a magnetoelectric memory. The room-temperature manipulation of magnetization by an electric field using the multiferroic BiFeO3 represents an essential step towards the magnetoelectric control of spintronics devices", Nature Materials, vol. 7, Jun. 2008, www.nature.com/naturematerials (2 pgs.).

Ying-Hao Chu, et al. "Electric-field control of local ferromagnetism using a magnetoelectric multiferroic", Nature Materials, vol. 7, Jun. 2008, www.nature.com/naturematerials (5 pgs.).

V.Garcia, et al. "Ferroelectric Control of Spin Polarization", Science, Feb. 26, 2010, vol. 327, No. 5969, pp. 1106-1110 (8 pgs.).

International Search Report and Written Opinion for related PCT Applilcation No. PCT/US2011/001573, Mailed Mar. 28, 2012 (11 pages).

International Search Report and Written Opinion for related PCT Applilcation No. PCT/US2011/001584, Mailed Apr. 20, 2012, (9 pages).

International Search Report and Written Opinion for related PCT Applilcation No. PCT/US2011/001585, Mailed Apr. 20, 2012, (10 pages).

Zavaliche, et al., "Electrically Assisted Magnetic Recording in Multiferroic Nanostructures," May 11, 2007, 5 pages, vol. 7, No. 6.

Driskill-Smith, et al., "STT-RAM—A New Spin on Universal Memory," Jul. 9, 2007, pp. 28-32, Future Fab Intl., vol. 23.

* cited by examiner

SPIN TORQUE TRANSFER MEMORY CELL STRUCTURES AND METHODS

TECHNICAL FIELD

The present disclosure relates generally to semiconductor memory devices, methods, and systems, and more particularly, to spin torque transfer (STT) memory cell structures and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, resistance variable memory, such as phase change random access memory (PCRAM) and resistive random access memory (RRAM), and magnetic random access memory (MRAM), such as spin torque transfer random access memory (STT RAM), among others.

MRAM devices can employ a magnetic tunneling junction (MTJ) that can be viewed as a multi-state resistor due to different relative orientations (e.g., parallel and antiparallel) of the magnetic moments, which can change the magnitude of a current passing through the device. In a write process, magnetic fields caused by currents passing through conductive lines (e.g., word and bit lines) can be used to switch a magnetic moment direction of a "free" material of the MTJ, which can place the device in a high or low resistance state. A read process can then be used to determine the state of cell.

As the size of MRAM cells decreases, the distance between adjacent cells also decreases, which can result in increased cell disturb caused by the current carrying lines used to switch the magnetic moment directions. As an example, the write current associated with a MRAM device can be about 10 mA. can be difficult as the size of the MRAM cells and current carrying lines decreases. For instance, the smaller width lines can require greater currents to produce the necessary switching fields, which increases power consumption.

STT devices share some of the operational features of previous MTJ cells; however, switching of the free material magnetic moment (e.g., the write process) can be produced by passage of the spin polarized current itself. For instance, unpolarized conduction electrons passing through a first magnetic material having its magnetic moment oriented in a given direction (e.g. a "pinned" material) are preferentially polarized by their passage through that material by a quantum mechanical exchange interaction with the polarized bound electrons in the material. Such a polarization can occur to conduction electrons that reflect from the surface of the magnetized material as well as to those that pass through it. The efficiency of such a polarization process can depend upon the crystalline structure of the material. When such a stream of polarized conduction electrons subsequently pass through a second magnetic material (e.g., the "free" material) whose polarization direction is not fixed in space, the polarized conduction electrons exert a torque on the bound electrons in the magnetic materials which, if sufficient, can reverse the polarization of the bound electrons and, thereby, reverse the magnetic moment of the magnetic material.

The use of a current internal to the cell to cause the magnetic moment reversal provides for smaller currents (e.g., about 200 microamps) than those required to produce an external magnetic field (e.g., from adjacent current carrying lines) to produce the moment switching. However, further reduction in the current used to produce magnetic moment switching in STT RAM cells can provide benefits such as further reducing the energy consumption and thermal profile in the materials associated with such cells, which can improve cell integrity and reliability, among other benefits.

DETAILED. DESCRIPTION

Figure 1A:
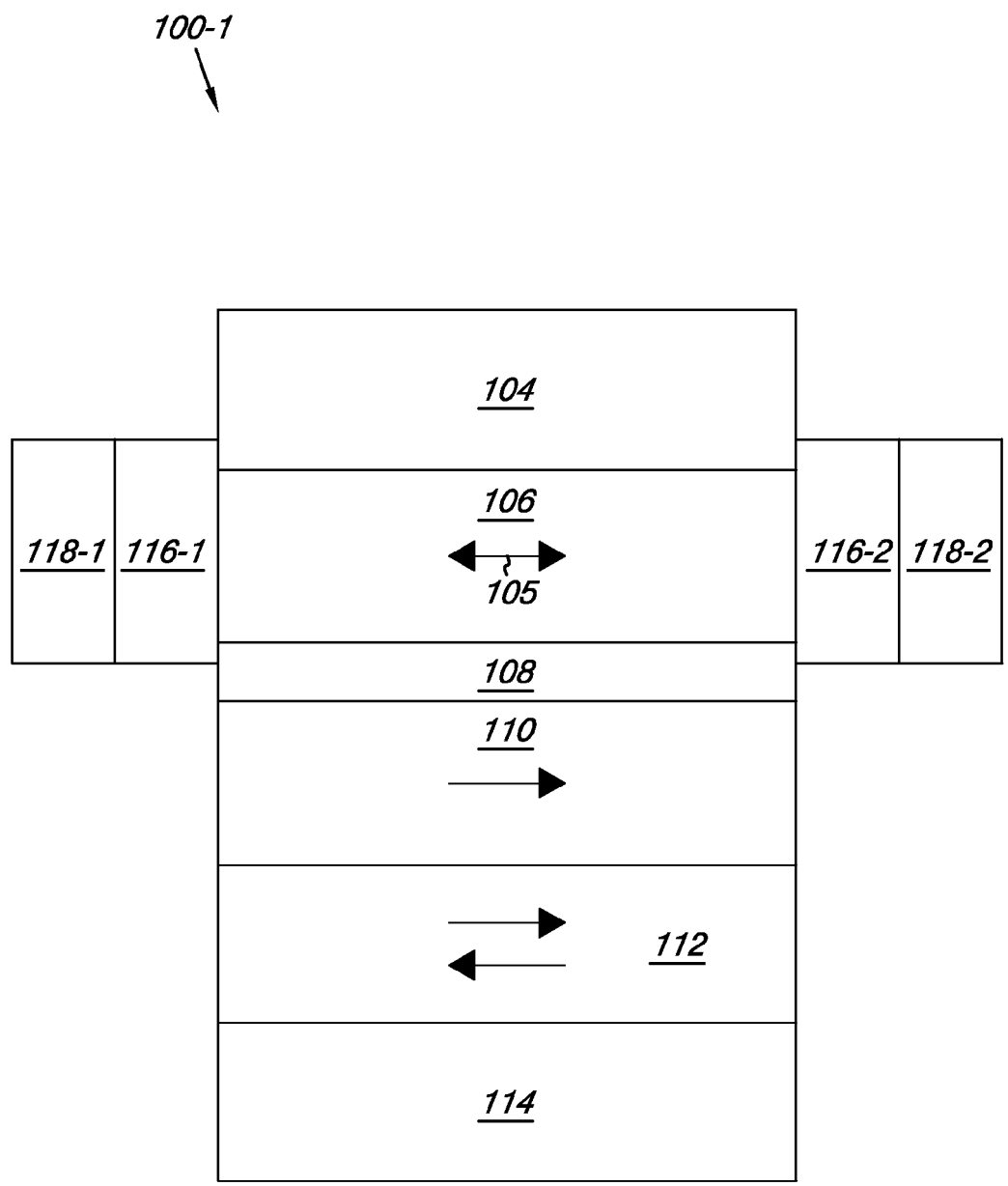
FIGS. 1A-1E illustrate SU memory cell structures in accordance with one or more embodiments of the present disclosure.

Spin Torque Transfer (STT) memory cell structures and methods are described herein. One or more STT memory cell structures include a tunneling barrier material positioned between a ferromagnetic storage material and a pinned ferromagnetic material in contact with an antiferromagnetic material and a multi ferroic material in contact with the ferromagnetic storage material, wherein the antiferromagnetic material, the ferromagnetic storage material, and the pinned ferromagnetic material are located between a first electrode and a second electrode.

Embodiments of the present disclosure provide various benefits such as providing magnetic switching within STT memory cells via an applied electric field (e.g., due to exchange coupling between a multiferroic material in contact with a ferromagnetic storage material associated with the cell). Embodiments can also provide for a reduced programming current as compared to previous STT memory cells. Embodiments can also provide benefits such as added data reliability and/or stability upon switching (e.g., by preventing thermally induced magnetic switching), among other benefits.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be referenced as 204 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIGS. 1A-1E illustrate STT memory cell structures in accordance with one or more embodiments of the present disclosure. The memory cell structure 100-1 illustrated in FIGS. 1A-1C includes a magnetic tunneling junction (MTJ) element positioned between a first electrode 104 (e.g. a top electrode) and a second electrode 114 (e.g., a bottom electrode). The MTJ element includes a tunneling barrier material 108 positioned between a ferromagnetic storage material 106 and a pinned ferromagnetic material 110 that is in contact with an antiferromagnetic material 112.

The arrow illustrated in the pinned ferromagnetic material 110 indicates the direction of magnetization in the material 110. The arrow 105 in the ferromagnetic storage material 106 of structure 100-1 indicates the alternative directions of the magnetization in material 106 (e.g., parallel or antiparallel to the magnetization direction of material 110). As one of ordinary skill in the art will appreciate, a spin polarized current can be applied to the MTJ element (e.g., in a current perpendicular to plane configuration between the electrodes 104 and 114), which can switch the magnetization direction of the ferromagnetic storage material 106 when the critical switching current density ($J_c$) is exceeded. The different directions of magnetization 105 can correspond to particular data states of an STT RAM cell.

One or more embodiments of the present disclosure can alter and/or control the magnetic polarization of a "free" magnetic material (e.g., magnetization direction 105 of ferromagnetic storage material 106) in an STT memory cell via application of electric fields, which can reduce the programming current used to achieve magnetic polarization switching, among other benefits. One or more embodiments include a multiferroic material (e.g., a ferroelectric antiferromagnetic multiferroic material and/or a ferroelectric ferromagnetic multiferroic material) in contact with the ferromagnetic storage material of an MTJ. Application of an electric field to the multiferroic material can be used to manipulate the antiferromagnetic ordering and/or ferromagnetic ordering within the multiferroic material (e.g., by changing the ferroelectric ordering coupled to the ferromagnetic and/or antiferromagnetic ordering within the multiferroic material). Exchange coupling between the multiferroic material (e.g., 116-1 and 116-2) and the ferromagnetic storage material (e.g., 106) influences the magnetic polarization (e.g., 105) of the ferromagnetic storage material. As such, the inherent coupling of the ferroic order parameters (e.g., the ferroelectric order parameter coupling with either or both of the ferromagnetic and antiferromagnetic order parameter) within a multiferroic material (e.g., 116-1 and 116-2) can be used to manipulate (e.g., switch) the magnetic polarization (e.g., 105) of a ferromagnetic material (e.g., 106) coupled thereto.

In some instances, the exchange coupling (e.g., antiferromagnetic and/or ferromagnetic exchange coupling) between the multiferroic and the ferromagnetic storage material may be sufficient to switch the magnetization direction of the storage material (e.g., from parallel to antiparallel or vice versa). In instances in which the exchange coupling between the multiferroic and storage material is insufficient to induce a full switching of the magnetization direction of the storage material, a "magnetic torque" can be induced that can reduce the current required to induce full switching in the STT memory cell. Moreover, the induced magnetic torque can provide added data reliability and/or stability upon switching (e.g., by preventing thermally induced magnetic switching).

Figure 1B:
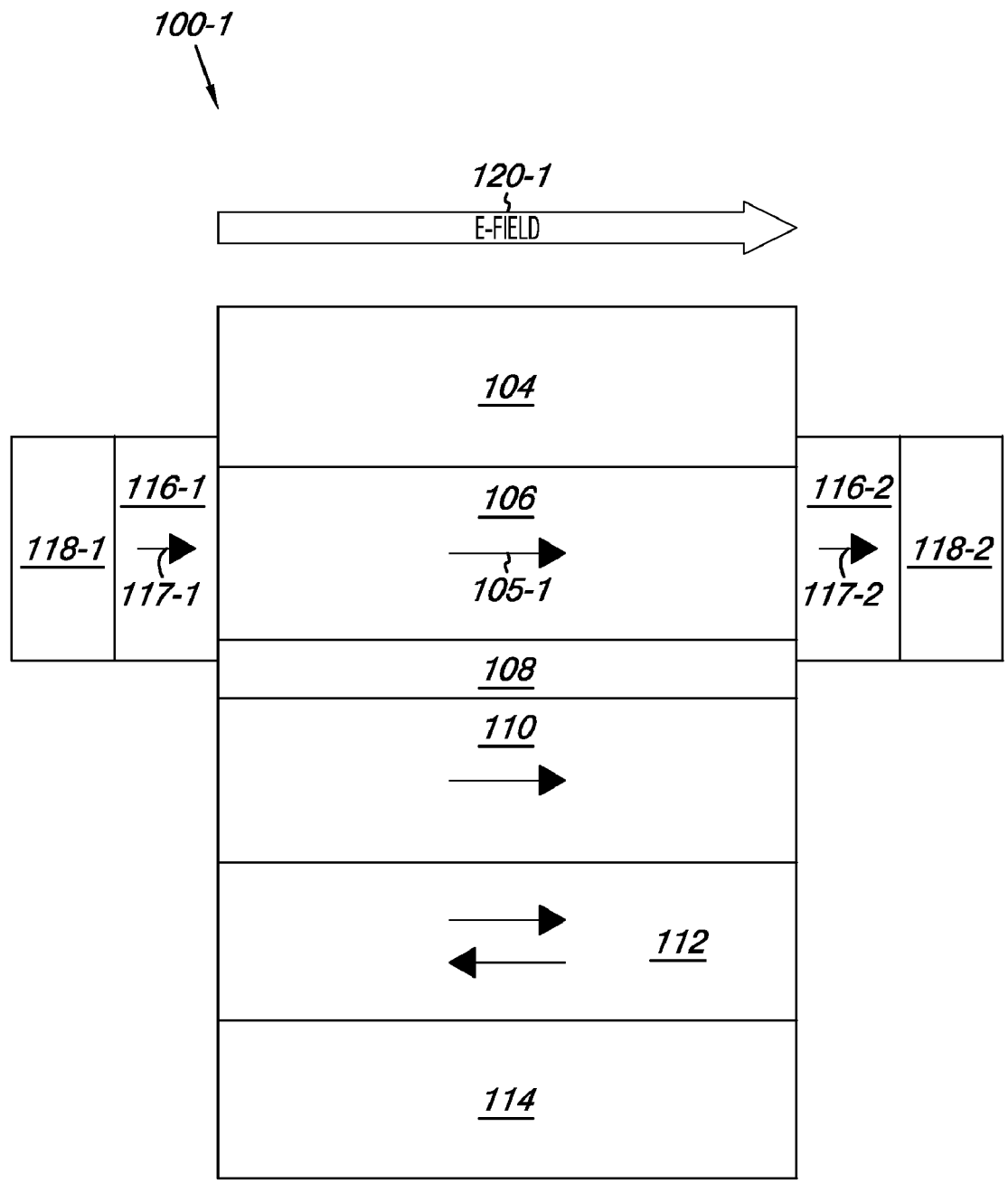
Figure 1C:
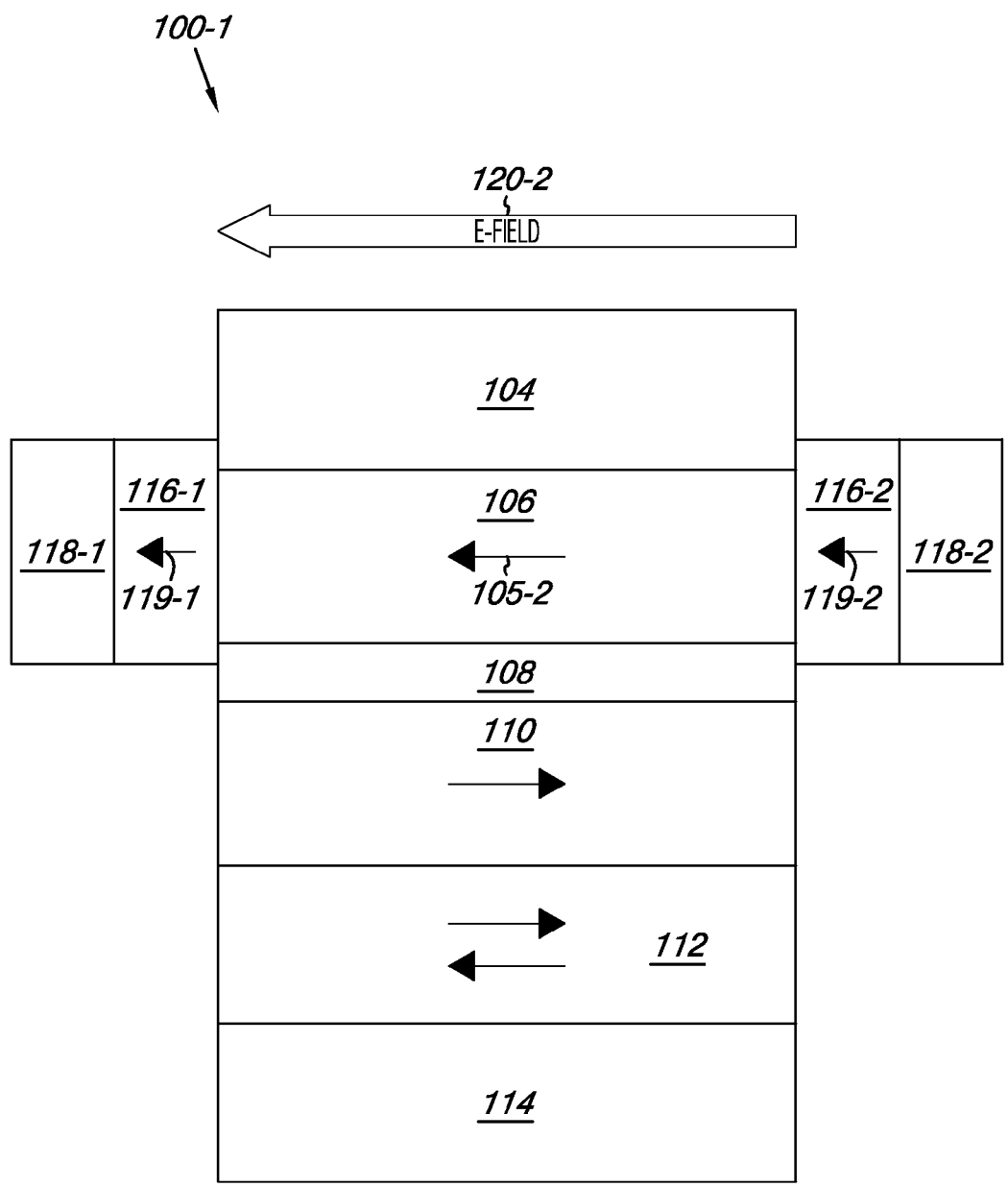

In the example illustrated in FIGS. 1A-1C, memory cell structure 100-1 includes a multiferroic material 116-1 in contact with ferromagnetic storage material 106 and a multiferroic material 116-2 in contact with ferromagnetic storage material 106. The structure 100-1 includes a third electrode 118-1 and a fourth electrode 118-2. The electrodes 118-1 and 118-2 are configured to provide an electric field to the multiferroic material 116-1 and 116-2. That is, an applied voltage difference between the electrodes 118-1 and 118-2 creates an electric field that affects the antiferromagnetic/ferromagnetic ordering of the multiferroic material 116-1 and 116-2, which can alter the magnetization direction 105 of the ferromagnetic storage material 106, as described above.

For instance, the embodiment illustrated in FIG. 1B illustrates an electric field 120-1 provided to the multiferroic material 116-1 and 116-2 via an applied voltage difference between the electrodes 118-1 and 118-2. The arrows 117-1 and 1172 indicate an example of the induced magnetization direction within the multiferroic material 116-1 and 116-2, respectively, due to the applied electric field 120-1. In the embodiment illustrated in FIGS. 1A-1C, the electrodes 118-1 and 1182 are coupled to (e.g., in contact with) respective multiferroic material 116-1 and 116-2; however, embodiments are not so limited. Arrow 105-1 indicates an example of the magnetization direction corresponding to the ferromagnetic storage material 106 of the MTJ (e.g., parallel to the magnetization direction of the pinned ferromagnetic material 110, in this example), responsive to the applied field 120-1 and corresponding exchange coupling between the multiferroic material 116-1/116-2 and the ferromagnetic storage material 106. The arrows 117-1, 117-2, and 105-1 are examples and may not represent the actual order parameter orientations within the respective materials.

The embodiment illustrated in FIG. 1C illustrates an electric field 20-2 provided to the multiferroic material 116-1 and 116-2 via an applied voltage difference between the electrodes 118-1 and 118-2. The arrows 119-1 and 119-2 indicate the induced magnetization direction with the multiferroic material 116-1 and 116-2, respectively, due to the applied electric field 120-2. Arrow 105-2 indicates the magnetization direction corresponding to the ferromagnetic storage material 106 of the MTJ (e.g., antiparallel to the magnetization direction of the pinned ferromagnetic material 110, in this example). In the example illustrated in FIG. 1C, the exchange coupling between the multiferroic material 116-1/116-2 and the ferromagnetic storage material 106 resulting from the electric field 120-2 is sufficient to switch the direction of the magnetization within the storage material 106 (e.g., from the parallel direction 105-1 shown in FIG. 1B to the antiparallel direction 105-2 shown in FIG. 1C). The arrows 119-1, 119-2, and 105-2 are examples and may not represent the actual order parameter orientations within the respective materials.

As noted above, in one or more embodiments, the electric field between the electrodes (e.g., 118-1 and 118-2) may not be sufficient to fully switch the magnetization of the ferromagnetic storage material 106. However, in such eases, a remnant magnetic torque can be induced within the storage material 106, which can reduce the barrier to switching in the STT memory cell. For instance, the required current density to induce switching of the magnetization (e.g., from direction 105-1 to 105-2) is reduced due to the exchange coupling between the multiferroic 116-1/116-2 and the storage material 106 under the applied electric field.

Figure 1D:
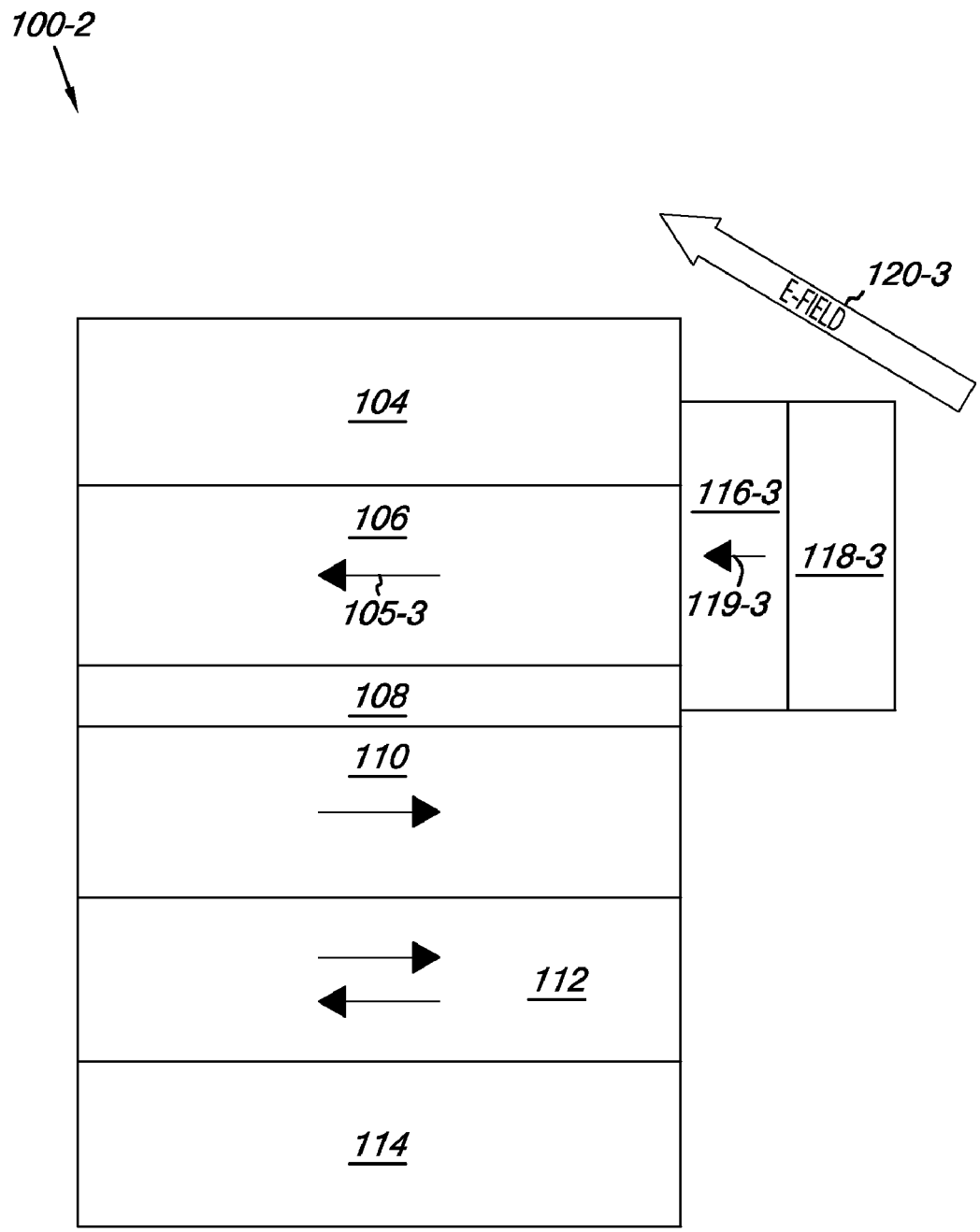

The memory cell structure 100-2 illustrated in FIG. 1D is similar to the memory cell structure 100-1 shown in FIGS. 1A-1C in that the structure 100-2 includes a MTJ element positioned between a first electrode 104 and a second electrode 114. The MTJ element includes a tunneling barrier material 108 positioned between a ferromagnetic storage material 106 and a pinned ferromagnetic material 110 that is in contact with an antiferromagnetic material 112.

The structure 100-2 includes a multiferroic material 116-3 in contact with ferromagnetic storage material 106. The structure 100-2 also includes a third electrode 118-3 configured to provide an electric field to the multiferroic material 116-3 responsive to an applied voltage between the third electrode 118-3 and at least one of the first electrode 104 and the second electrode 114. In the embodiment illustrated in FIG. 1D, an electric field 120-3 is shown between the third electrode 118-3 and the first electrode 104 (e.g., the top electrode). The electric field 120-3 is sufficient to induce a magnetic polarization change in the multiferroic material 116-3 (e.g., as indicated by arrow 119-3). The exchange coupling (e.g., antiferromagnetic exchange coupling and/or ferromagnetic coupling) between the multiferroic 116-3 and the ferromagnetic storage material 106 can influence the magnetization direction 105-3 of the ferromagnetic storage material 106. The arrows 119-3, and 105-3 are examples and may not represent the actual order parameter orientations within the respective materials.

Figure 1E:
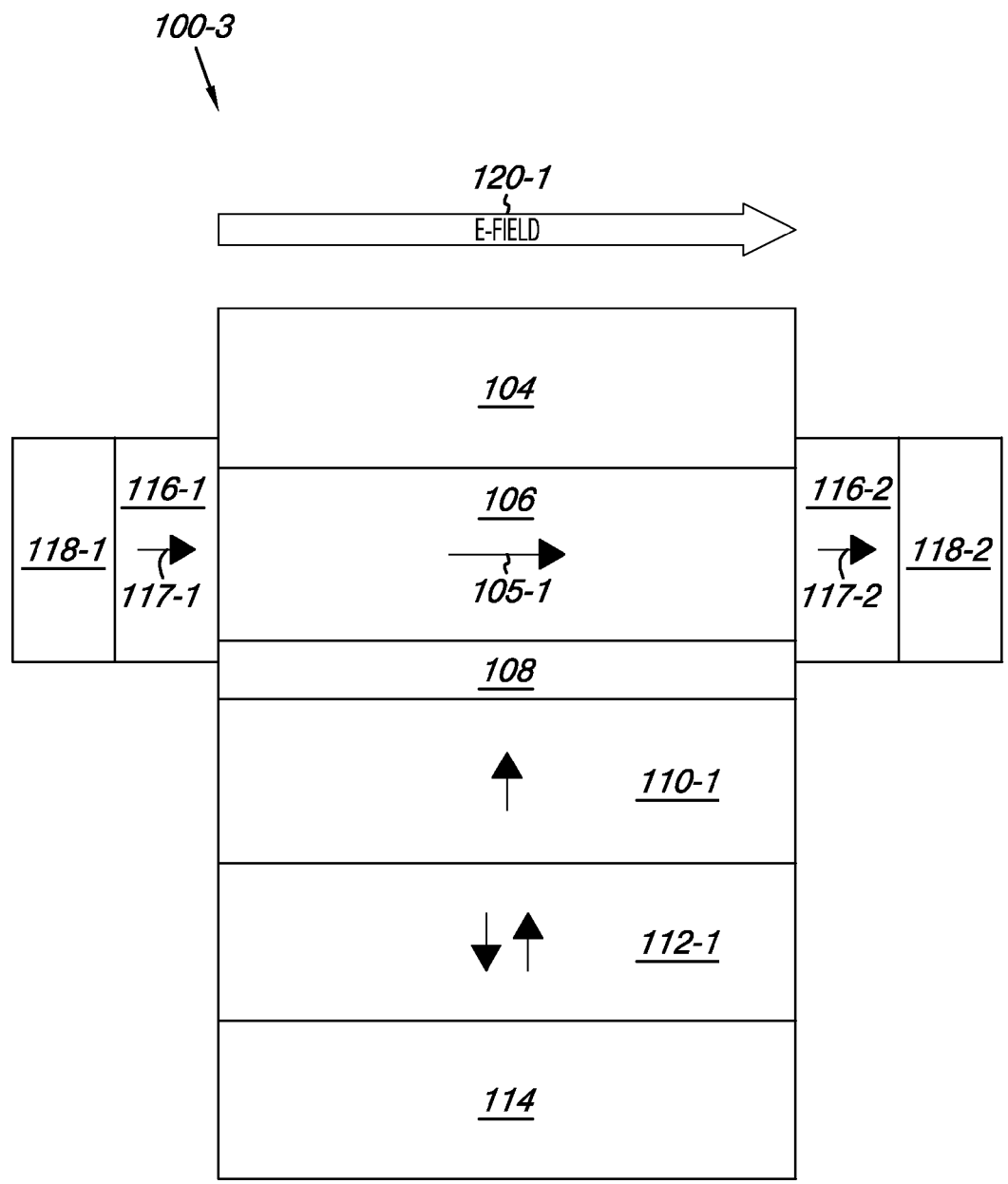

The memory cell structure 100-3 illustrated in FIG. 1E is similar to the memory cell structure 100-1 shown in FIGS. 1A-1C in that the structure 100-3 includes a MTJ element positioned between a first electrode 104 and a second electrode 114. The MTJ element includes a tunneling barrier material 108 positioned between a ferromagnetic storage material 106 and a pinned ferromagnetic material 110-1 that is in contact with an anti ferromagnetic material 112-1. However, in the example illustrated in FIG. 1E, the magnetization directions of the pinned ferromagnetic material 110-1 and the antiferromagnetic material 110-2 have a vertical orientation (e.g., as compared to a horizontal, or lateral, orientation illustrated in FIGS. 1A-1C).

Like the example illustrated in FIG. 1B, memory cell structure 100-3 shown in FIG. 1E includes a multiferroic material 116-1/116-2 in contact with ferromagnetic storage material 106. The structure 100-3 also includes a third electrode 118-1 and a fourth electrode 118-2 configured to provide an electric field to the multiferroic material 116-1 and 116-2. In this example, an electric field 120-1 is provided to the multiferroic material 116-1 and 116-2 via an applied voltage difference between the electrodes 118-1 and 118-2. The arrows 117-1 and 117-2 indicate the induced magnetization direction within the multiferroic material 116-1 and 116-2, respectively, due to the applied electric field 120-1. Arrow 105-1 indicates the magnetization direction corresponding to the ferromagnetic storage material 106 of the MTJ. The arrows 117-1, 117-2, and 105-1 are examples and may not represent the actual order parameter orientations within the respective materials.

The magnetization direction 105-1 of ferromagnetic storage material 106 can correspond to a particular data state (e.g., "1" or "0") of the STT memory cell. The data state of the STT memory cell can then be altered (e.g., switched) via application of an electric field in a direction opposite to electric field 120-1, as described above.

The electrodes 104, 114, 118-1, 118-2, 118-3 can be made of various conductive materials or composite structures that can include, but are not limited to titanium, TiN (titanium nitride), TaN (tantalum nitride), copper, iridium, platinum, ruthenium, tantalum, and/or tungsten, for example. As an example, in one or more embodiments, the bottom electrode 114 can include a seed material or can include a seed material/conductive material/capping material composite configuration.

Although embodiments are not limited to particular materials, the ferromagnetic storage material 106 can be CoFeB, NiFe, or antiferromagnetically coupled materials such as CoFeB/Ru/CoFeB, for example. The tunneling barrier material 108 can be MgO, $Al_2O_3$, or other magnetic insulators, for example. The pinned ferromagnetic material 110 can be Fe, FeNi, Co, FeB, CoFeB, or various synthetic antiferromagnetic (SAF) structures such as CoFe/Ru/CoFe or CoFe/Ru/ CoFeB, for example. The antiferromagnetic material 112 can be NiO, CoO, FeMn, PtMn, IrMn, NiMn, or a synthetic antiferromagnet (e.g., a composite structured antiferromagnet), for example. The multiferroic material (e.g., 116-1, 116-2, 116-3) can be $BiFeO_3$ (BFO), $TbMn_2O_5$, or $TbMnO_3$, for example. The multiferroic material can also be $Bi_4Fe_2TiO_{12}$ or $NiBi_2O_4$ (e.g., when the multiferroic is a ferroelectric ferromagnetic multiferroic). Although not illustrated in FIGS. 1A-1E, the STT memory cell structures 100-1, 100-2, and 100-3 can be coupled to an access device such as an access transistor formed on a substrate, for example. As described below in connection with FIGS. 3A-3C, the access device can be a vertical transistor, in one or more embodiments.

Figure 2A:
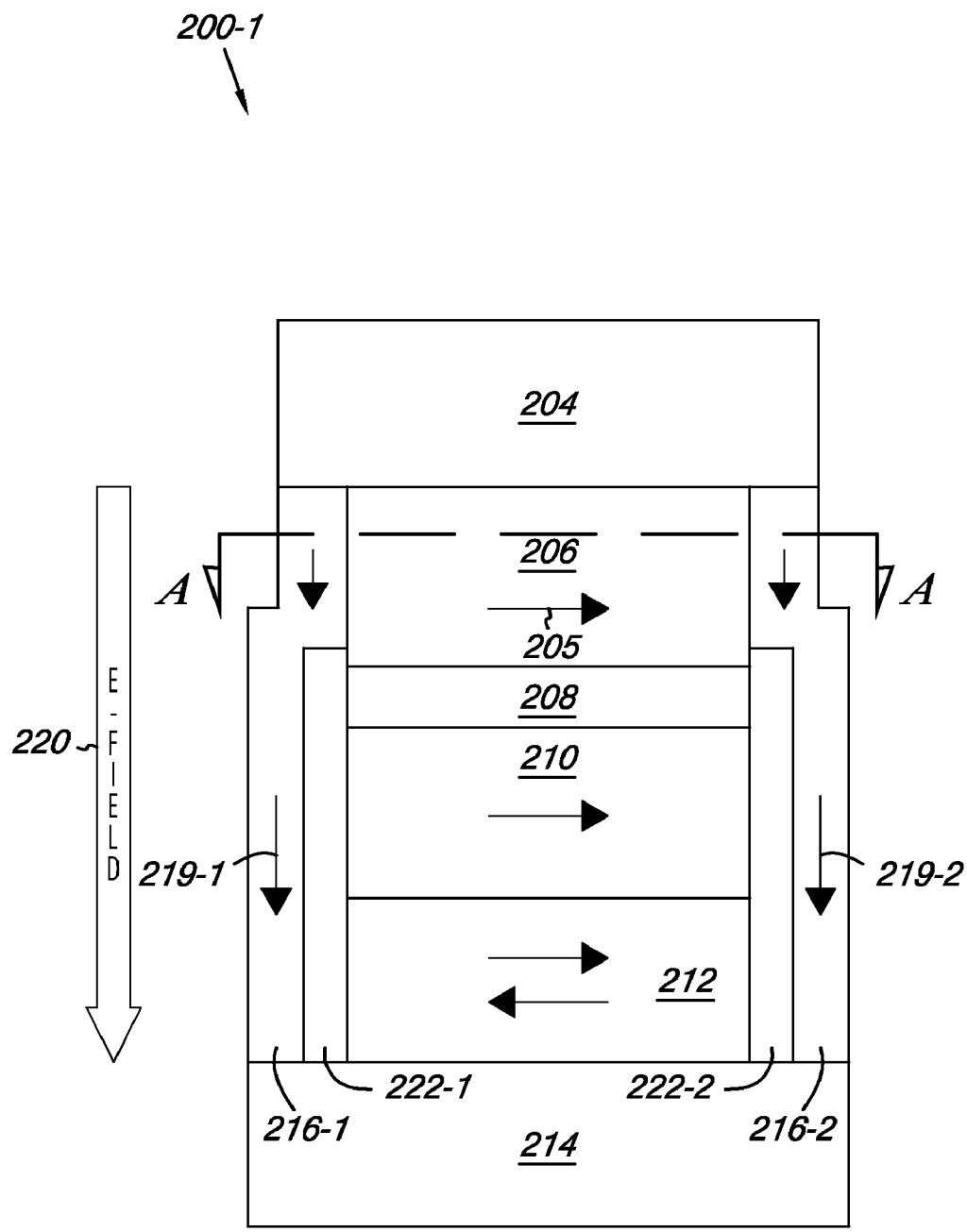
FIGS. 2A-2C illustrate SIT memory cell structures in accordance with one or more embodiments of the present disclosure.
Figure 2B:
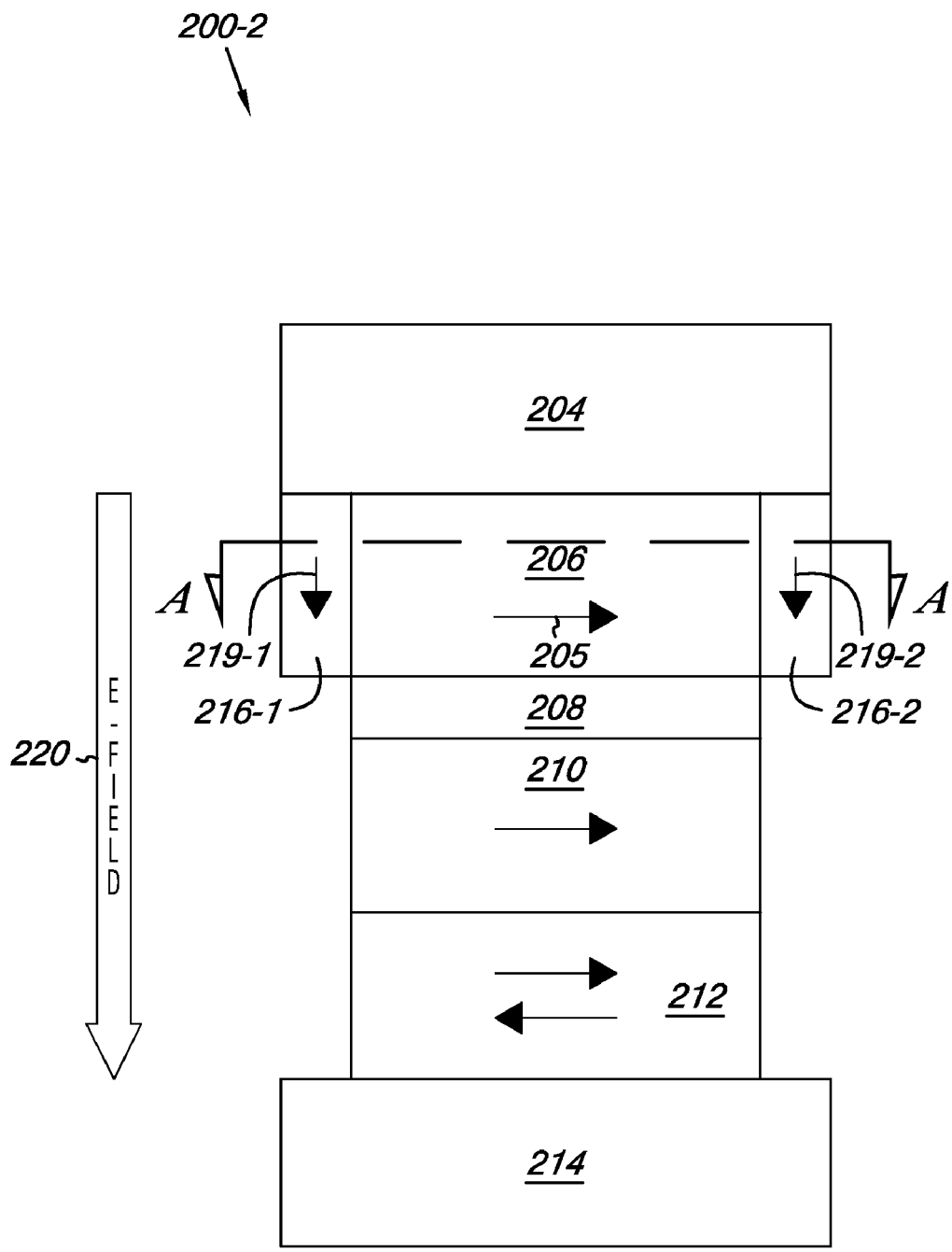
Figure 2C:
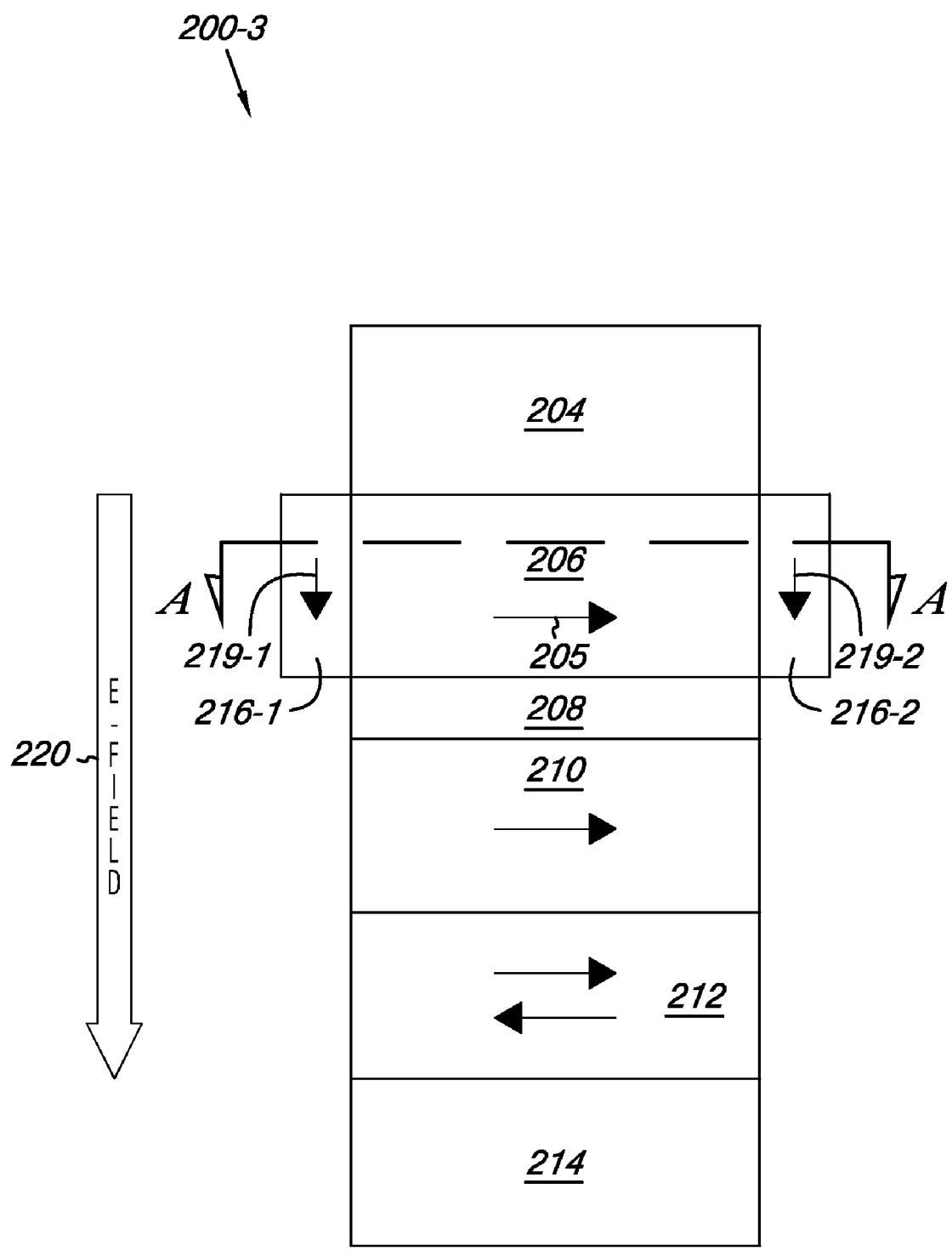

FIGS. 2A-2C illustrate STT memory cell structures in accordance with one or more embodiments of the present disclosure. The memory cell structures 200-1, 200-2, and 200-3 of FIGS. 2A, 2B, and 2C, respectively, include a MTJ element positioned between a top electrode 204 and a bottom electrode 214. The MTJ element includes a tunneling barrier material 208 positioned between a ferromagnetic storage material 206 and a pinned ferromagnetic material 210 that is in contact with an antiferromagnetic material 212.

The arrow illustrated in the pinned ferromagnetic material 210 indicates the direction of magnetization in the material 210. The arrow 205 in the ferromagnetic storage material 206 of structure 200 indicates the alternative directions of the magnetization within material 206 (e.g., parallel or antiparallel to the magnetization direction of material 210). As described above, the magnetic polarization of the "free" material (e.g., storage material 206) can be altered and/or controlled via application of electric fields, which can reduce the programming current used to achieve magnetic polarization switching of ferromagnetic storage material 206, among other benefits.

The memory cell structures 200-1, 200-2, and 200-3 include a multiferroic material 216-1 in contact with ferromagnetic storage material 206 and a multiferroic material 216-2 in contact with ferromagnetic storage material 206. The top electrode 204 and the bottom electrode 214 are configured to provide an electric field to the multiferroic material 216-1/216-2 responsive to a voltage applied between the top electrode 204 and the bottom electrode 214. In this example, an applied voltage difference between the electrodes 204 and 214 creates an electric field 220 that affects the antiferromagnetic ordering (e.g., when the multiferroic material is a ferroelectric antiferromagnetic multiferroic) and/or ferromagnetic ordering (e.g., when the multiferroic is a ferroelectric ferromagnetic multiferroic) of the multiferroic material 216-1 and 216-2, which can alter the magnetization direction 205 of the ferromagnetic storage material 206, as described above.

In FIG. 2A, the multiferroic material 216-1 and 216-2 of the memory structure 200-1 is continuous between the electrodes 204 and 214. As such, the memory structure 200-1 includes oxide spacers 222-1 and 222-2 located between respective portions of multiferroic material 216-1/216-2 and materials 208, 210, and 212. Embodiments are not so limited. For example, the multiferroic material 216-1 and 216-2 of the memory structures 200-2 and 200-3 shown in respective FIGS. 2B and 2C is not continuous between the electrodes 204 and 214. As such, the oxide spacers 222-1 and 222-2 may be optional, in some embodiments. In the example illustrated in FIG. 2C, the multiferroic material 216-1 and 216-2 is not located directly below the top and bottom electrodes 204 and 214. However, the electric field created between the electrodes 204 and 214 responsive to an applied voltage will still effect the ferroelectric ordering within the multiferroic material 216-1 and 216-2, which will in turn effect the antiferromagnetic and/or ferromagnetic ordering within the multiferroic material 216-1 and 216-2, resulting in changes in the magnetization direction 205 of ferromagnetic storage material 206.

The arrows 219-1 and 219-2 can indicate the induced magnetization direction within the multiferroic material 216-1 and 216-2, respectively, due to the applied electric field 220. Arrow 205 indicates the magnetization direction corresponding to the ferromagnetic storage material 206 of the MTJ (e.g., parallel to the magnetization direction of the pinned ferromagnetic material 210, in this example). The arrows 219-1, 217-2, and 1205 are examples and may not represent the actual order parameter orientations within the respective materials.

As one of ordinary skill in the art will appreciate upon reading this disclosure, providing an oppositely directed, electric field 220 to the MTJ element of structures 200-1, 200-2, and 200-3 can exert a magnetic torque on the ferromagnetic storage material 206 (e.g., via the exchange coupling between the storage material 206 and the multiferroic material 216-1/216-2). In various instances, the exerted magnetic torque may be sufficient to switch the magnetization direction within storage material 206 (e.g., from parallel to antiparallel). As such, the stored data state of the STT memory cell structure 200 can be switched via an applied electric field. As discussed above, even if the applied electric field 220 is not sufficient to induce a switching of the magnetization direction 205, the magnetic torque exerted on the storage material 206 can be sufficient to reduce the current density required to switch the magnetization direction 205 during a write process.

Figure 2D:
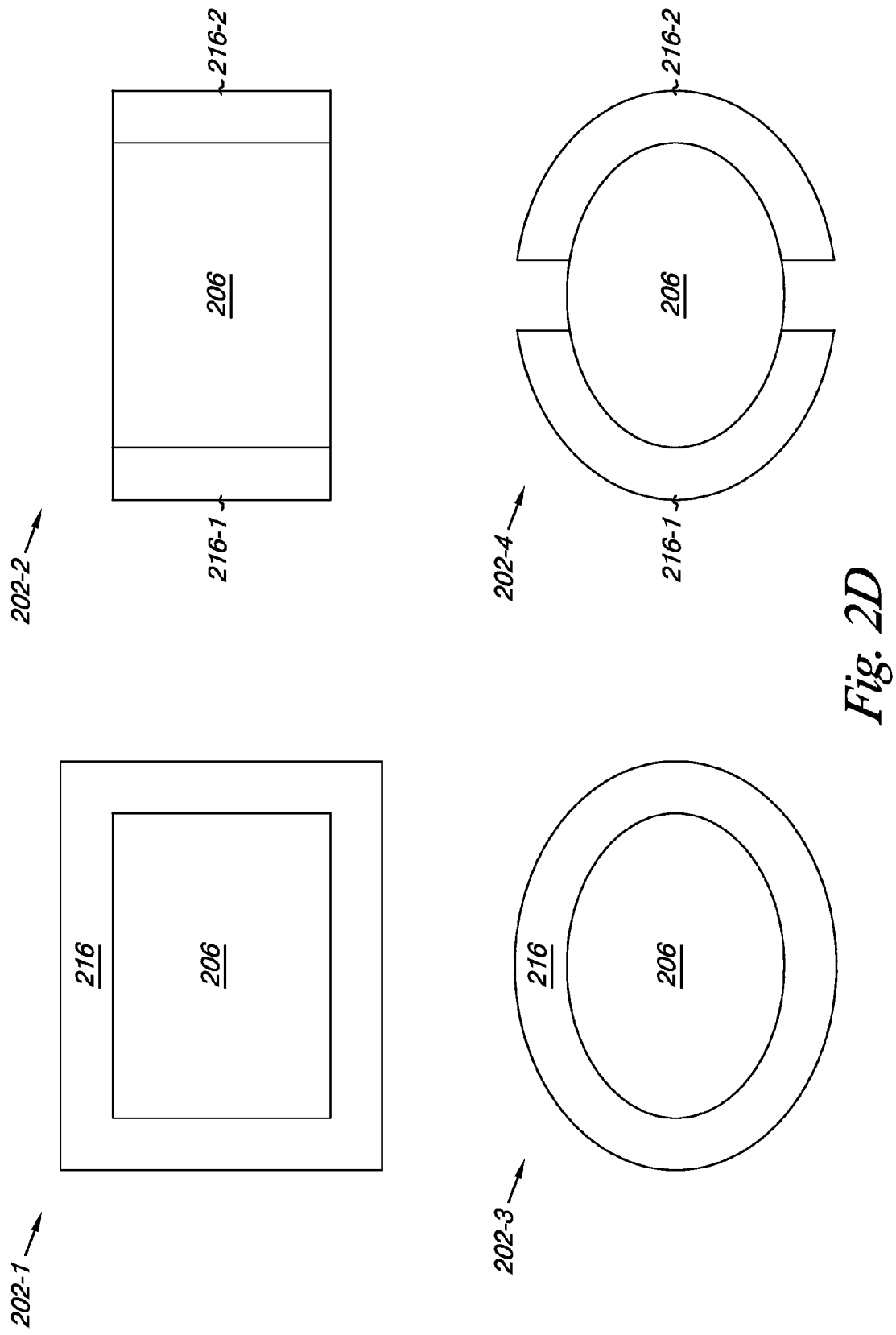
FIG. 2D illustrates a number of example over head cross-sectional views through cut line A shown in FIGS. 2A-2C in accordance with embodiments of the present disclosure.

FIG. 2D illustrates a number of example over head cross-sectional views through cut line A shown in FIGS. 2A-2C in accordance with embodiments of the present disclosure. As illustrated in FIG. 2D, the ferromagnetic storage material 206 and the multiferroic material 216-1/216-2 in contact with the storage material 206 can have various shapes.

For instance, cross-sectional views 202-1 and 202-2 illustrate ferromagnetic storage material 206 having a quadrilateral (e.g., rectangular) shape, while cross-sectional views 202-3 and 202-4 illustrate ferromagnetic storage material 206 having a round (e.g., oval) shape. Embodiments are not limited to a particular cross-sectional shape. For example, the shapes can be circular, square, or hexagonal, among various other shapes.

As illustrated in cross-sectional views 202-1 and 202-3, the multiferroic material 216 in contact with the ferromagnetic storage material 206 can be a continuous material 216, in various embodiments. As such, the multiferroic material 216-1 and 216-2 shown in FIGS. 2A-2C may be a single multiferroic material 216. However, embodiments are not so limited. For example, in some embodiments, the multiferroic materials 216-1 and 216-2 may be different multiferroic materials.

Figure 3A:
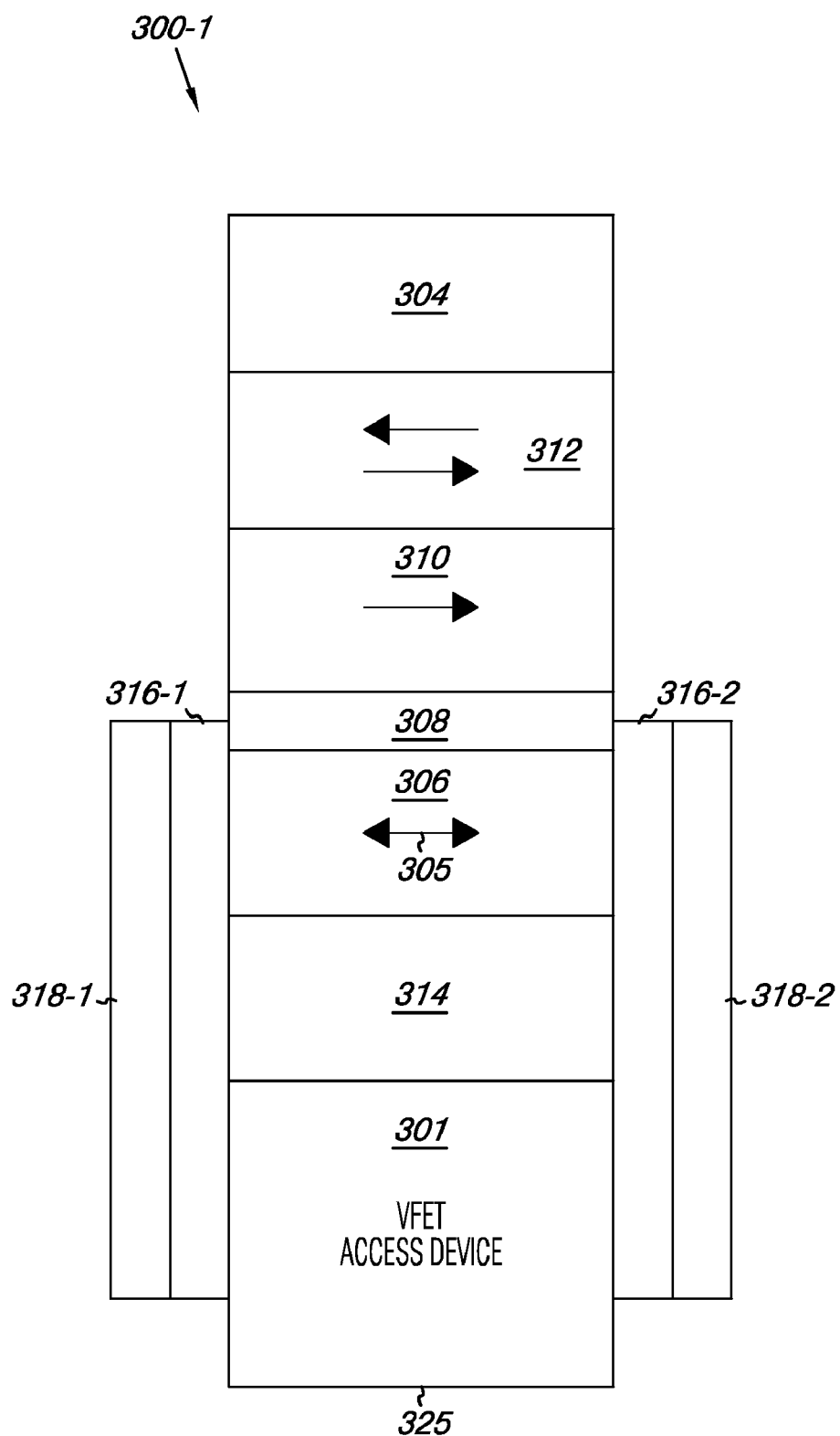
FIGS. 3A-3C illustrate STT memory cell structures in accordance with one or more embodiments of the present disclosure.
Figure 3B:
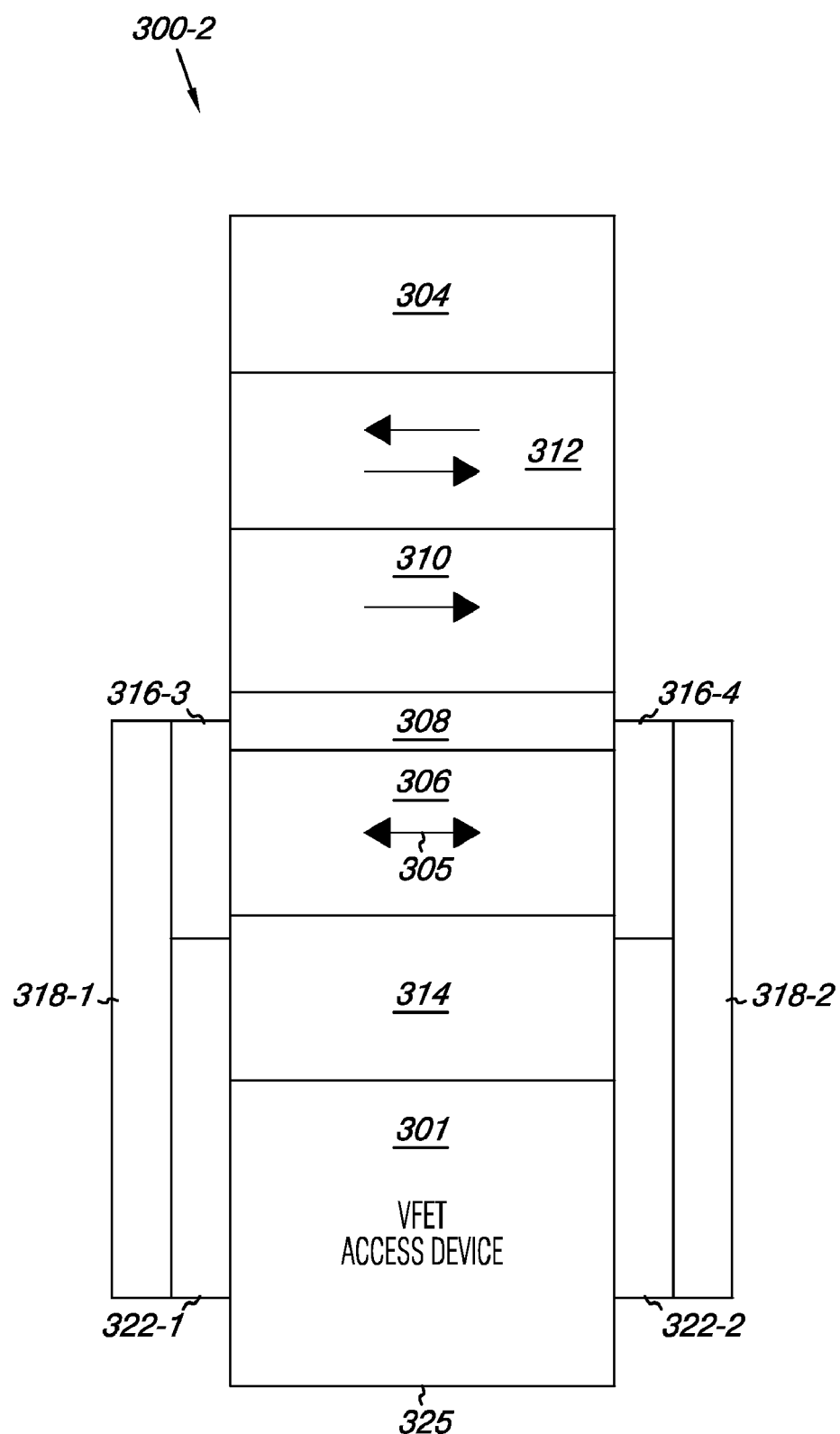
Figure 3C:
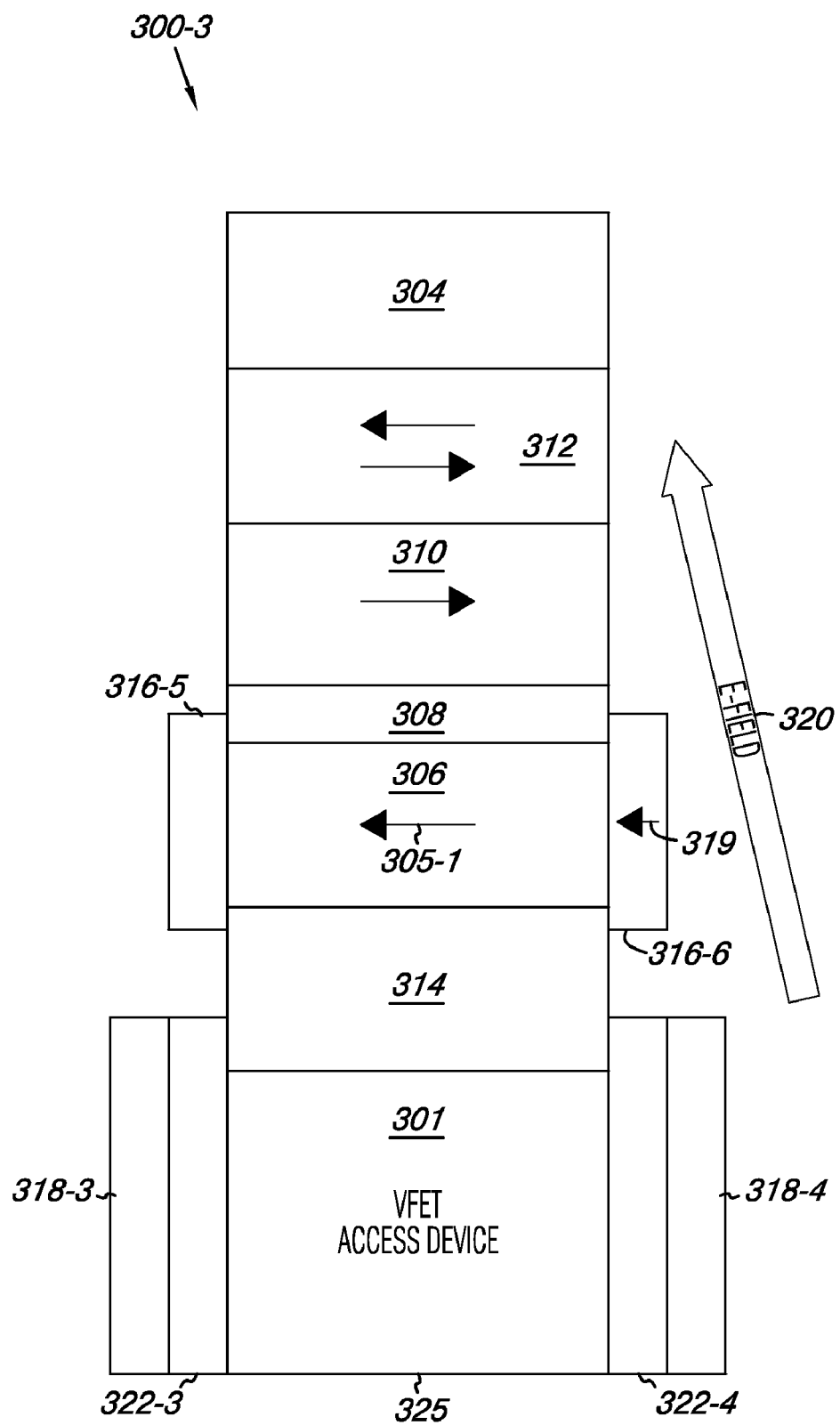

FIGS. 3A-3C illustrate SIT memory cell structures in accordance with one or more embodiments of the present disclosure. The memory cell structures 300-1, 300-2, and 300-3 illustrated in FIGS. 3A, 3B, and 3C, respectively, include a MTJ element positioned between a first electrode 304 (e.g. a top electrode) and a second electrode 314 (e.g., a bottom electrode). The WI element includes a tunneling barrier material 308 positioned between a ferromagnetic storage material 306 and a pinned ferromagnetic material 310 that is in contact with an antiferromagnetic material 312, The STT memory cell structures 300-1, 300-2, and 300-3 are each coupled to an access device 325 formed from or on a substrate 301. In this example, the access device 325 is a vertical field effect transistor (VFET). The substrate 301 can be a silicon substrate, silicon on insulator (SOI) substrate, or silicon on sapphire (SOS) substrate, among others.

In the embodiment illustrated in FIG. 3A, memory cell structure 300-1 includes a multiferroic material 316-1 in contact with ferromagnetic storage material 306 and a multiferroic material 316-2 in contact with ferromagnetic storage material 306. The structure 300-1 includes a third electrode 318-1 and a fourth electrode 318-2. The electrodes 318-1 and 318-2 are configured to provide an electric field to the multiferroic material 316-1 and 316-2. That is, an applied voltage difference between the electrodes 318-1 and 318-2 creates an electric field that affects the antiferromagnetic and/or ferromagnetic ordering of the multiferroic material 316-1 and 316-2, which can alter the magnetization direction 305 of the ferromagnetic storage material 306, as described above.

In the embodiment illustrated in FIG. 3A, the third electrode 318-1 and the fourth electrode 318-2 also serve as gates (e.g., side gates) of the VFET 325. As shown in FIG. 3A, the multiferroic material 316-1/316-2 functions as a gate oxide for the VFET 325. As such, the multiferroic material 316-1/316-2 provides exchange coupling between the multiferroic material and the ferromagnetic storage material 306, as well as providing an insulating material between the gate electrodes 318-1/318-2 and the bottom electrode 314. In one or more embodiments, the gate electrodes 318-1/318-2 can form a "surround gate" structure. For instance, the electrodes 318-1/318-2 can wrap around the access device 325. In some such embodiments, the electrodes 318-1/318-2 can be a single gate electrode that can surround the access device 325 and/or the multiferroic material (e.g., 316-1 and 316-2).

In the embodiment illustrated in FIG. 3B, memory cell structure 300-2 includes a multiferroic material 316-3 in contact with ferromagnetic storage material 306 and a multiferroic material 316-4 in contact with ferromagnetic storage material 306. Similar to the structure 300-1 shown in FIG. 3A, the structure 300-2 includes a third electrode 318-1 and a fourth electrode 318-2 that are gates of the VFET 325. However, the structure 300-2 includes a gate oxide material 322-1 and 322-2 in addition to the multiferroic material 316-3 and 316-4. In this example, the multiferroic material 316-3 is located above a gate oxide material 322-1 associated with VFET 325 and the multiferroic material 316-4 is located above a gate oxide material 322-2 associated with the VFET 325. The magnetization direction 305 of ferromagnetic storage material 306 can be controlled via exchange coupling between the storage material 306 and the multiferroic material 316-3/316-4 induced by electric fields applied to the multiferroic material 316-3/316-4 (e.g., a lateral electric field between electrodes 318-1 and 318-2).

In the embodiment illustrated in FIG. 3C, memory cell structure 300-3 includes a multiferroic material 316-5 in contact with ferromagnetic storage material 306 and a multiferroic material 316-6 in contact with ferromagnetic storage material 306. Similar to the structures 300-1 shown in FIGS. 3A and 300-2 shown in FIG. 3B, the structure 300-3 includes a third electrode 318-3 and a fourth electrode 318-4 that are gates of the VFET 325.

However, in embodiment illustrated in FIG. 3C, the electric field (e.g., 320) provided to the multiferroic material 316-5/316-6 to control the magnetization direction 305-1 of ferromagnetic storage material 306, via the exchange coupling between the material 306 and the multiferroic 316-5/316-6, is provided by an applied voltage difference between at least one of the gate electrodes 318-3/318-4 (e.g., 318-4 as shown in FIG. 3C) and the top electrode 304.

As illustrated in FIG. 3C, the electric field 320 between gate electrode 318-4 and the top electrode 304 provides a magnetic polarization direction 319 within multiferroic material 316-6. The exchange coupling between the multiferroic 316-6 and the ferromagnetic storage material 306 consequently results in the magnetization direction 305-1 of storage material 306 having an antiparallel configuration (e.g., magnetization 305-1 is anti parallel to the magnetization direction of the pinned ferromagnetic material 310). The arrows 319 and 305-1 are examples and may not represent the actual order parameter orientations within the respective materials.

Figure 4:
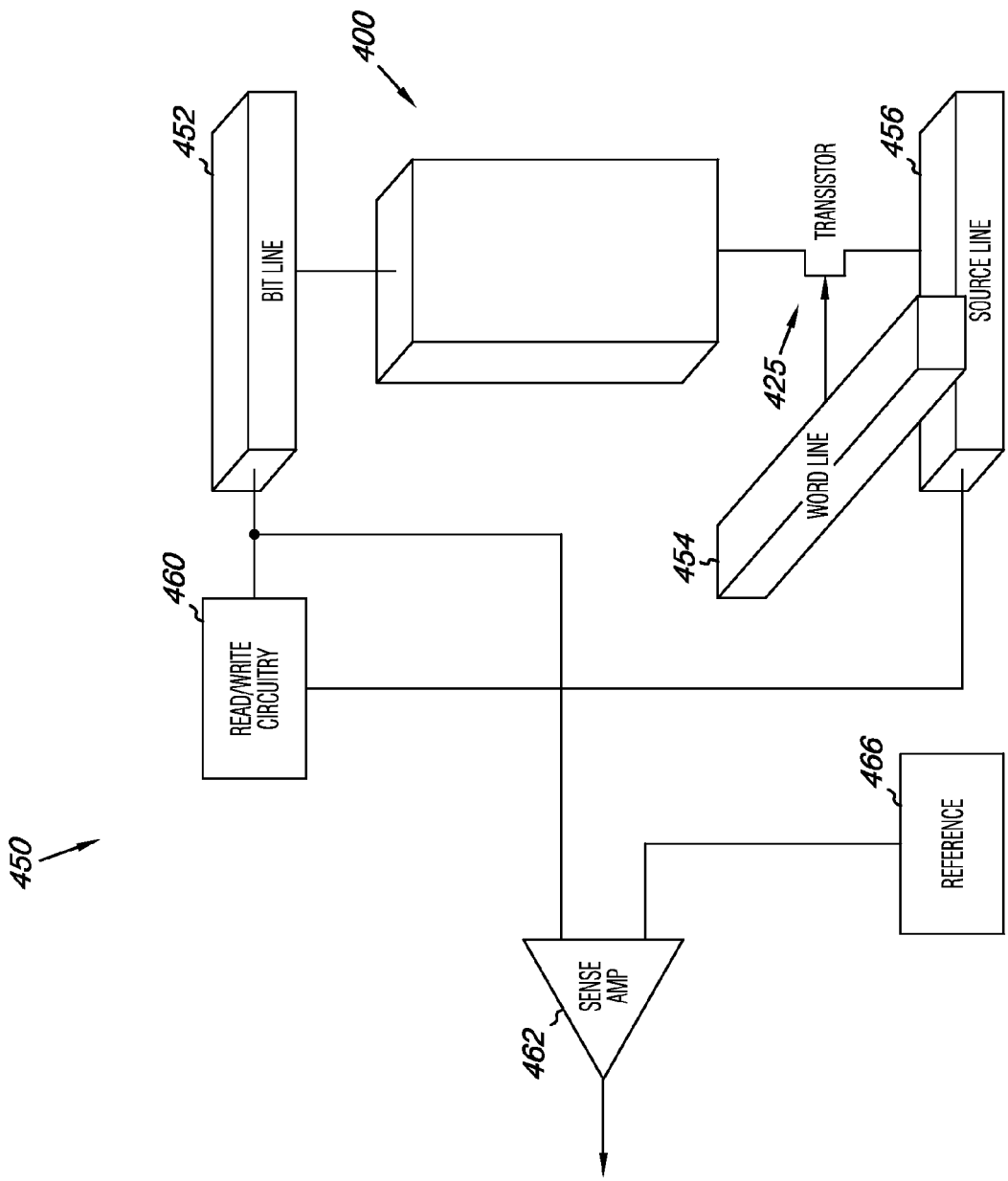
FIG. 4 illustrates a portion of a memory array having one or more STT memory cell structures in accordance with embodiments of the present disclosure.

As discussed further in connection with FIG. 4, the STT memory cell structures 300-1, 300-2, and 300-3 and corresponding access devices 325 can be coupled to various other electronic components such as bit lines, word lines, source lines, read circuitry, and write circuitry, among other components for operating a STT RAM array.

FIG. 4 illustrates a portion of a memory array 450 having one or more STT memory cell structures in accordance with embodiments of the present disclosure. An STT RAM cell can include an STT memory cell structure (e.g., such as structures 100-1, 100-2, 100-3, 200, 300-1, 300-2, and 300-3 described above) coupled to an access transistor 425. The access transistor 425 can be a vertical HT such as VFET 325 shown in FIGS. 3A-3C.

In this example, the array 450 includes a bit line 452, a word line 454, a source line 456, read/write circuitry 460, a bit line reference 466, and a sense amplifier 462. The STT memory structure 400 can include a MTJ element. As described above, the STT memory structure 400 can include a multiferroic material coupled to (e.g., in contact with) one or more portions of a ferromagnetic storage material of the MTJ, as well as additional circuitry, where necessary, to actuate electrodes for multiferroic switching.

In operation, the STT memory cell structure 400 can be selected to be programmed. An electric field can be provided via voltage differences applied across electrodes corresponding to structure 400 in order to induce magnetic polarization changes in the multiferroic material of the structure 400, which results in corresponding magnetization changes within the ferromagnetic storage material of structure 400. In various instances, the applied electric field can be sufficient to switch the magnetization direction of the storage material (e.g., without providing additional programming current to the cell).

In instances in which the applied electric field is not sufficient to induce full switching of the magnetization of the ferromagnetic storage material, a programming current can be applied to the cell, and the current can be spin-polarized by the pinned ferromagnetic material of the MTJ element such that a torque (e.g., a torque in addition to the torque provided to the magnetic moments within the ferromagnetic storage material due to the exchange coupling between the storage material and a multiferroic material) is exerted on the ferromagnetic storage material (e.g., ferromagnetic storage material 106, 206, or 306 described above), which can switch the magnetization of the ferromagnetic storage material to "write to" or "program" the cell. In this manner, the application of the electric field can be used to reduce the programming current (e.g., the critical switching current) required to switch the magnetization of the cell.

In programming operations in which a programming current is used, the read/write circuitry 460 may generate a programming current to the bit line 452 and the source line 456. Once the ferromagnetic storage material is magnetized according to the spin polarity of the programming current, the programmed state is written to the STT RAM cell.

To read the STT RAM cell, the read/write circuitry 460 generates a read current to the bit line 452 and the source line 456 through the structure 400 and the transistor 425. The programmed state of the STT RAM cell depends on the resistance across the structure 400, which may be determined by the voltage difference between the bit line 452 and the source line 456 in one or more embodiments, the voltage difference may be compared to a reference 466 and amplified by a sense amplifier 462.

One or more embodiments of the present disclosure can induce magnetization switching of an STT RAM cell via applied electric fields, which can provide various benefits. For instance, embodiments can reduce the current density required to induce magnetization switching in STT RAM cells. Embodiments can also assist with preventing thermally induced magnetic switching, which can provide added reliability and/or stability associated with STT RAM cells, among other benefits.

Spin Torque Transfer (STT) memory cell structures and methods are described herein. One or more STT memory cell structures include a tunneling barrier material positioned between a ferromagnetic storage material and a pinned ferromagnetic material in contact with an antiferromagnetic material and a multiferroic material in contact with the ferromagnetic storage material, wherein the antiferromagnetic material, the ferromagnetic storage material, and the pinned ferromagnetic material are located between a first electrode and a second electrode.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A spin torque transfer memory cell structure, comprising:
    a tunneling barrier material positioned between a ferromagnetic storage material and a pinned ferromagnetic material in contact with an antiferromagnetic material; and
    a multiferroic material in contact with the ferromagnetic storage material;

wherein the antiferromagnetic material, the ferromagnetic storage material, and the pinned ferromagnetic material are located between a first electrode and a second electrode; and a third electrode configured to provide an electric field to the multiferroic material responsive to an applied voltage between the third electrode and at least one of the first electrode and the second electrode;

wherein the third electrode is a gate of a vertical access device.

2. The memory cell structure of claim 1, wherein the electric field provided to the multiferroic material is sufficient to:
induce a change in antiferromagnetic and/or ferromagnetic ordering of the multiferroic material; and
provide antiferromagnetic exchange coupling and/or ferromagnetic coupling between the multiferroic material and the ferromagnetic storage material such that a magnetization of the ferromagnetic storage material is altered.

3. The memory cell structure of claim 1, including a fourth electrode configured to provide an electric field to the multiferroic material responsive to a voltage applied between the third electrode and the fourth electrode.

4. The memory cell structure of claim 3, wherein the fourth electrode is a gate of the vertical access device.

5. The memory cell structure of claim 1, wherein the antiferromagnetic material is a synthetic antiferromagnet.

6. The memory cell structure of claim 1, wherein the multiferrioc material is bismuth ferrite ($BiFeO_3$).

7. The memory cell structure of claim 1, wherein the first electrode and the second electrode are configured to provide an electric field to the multiferroic material responsive to a voltage applied between the first electrode and the second electrode.

8. A spin torque transfer memory cell, comprising:
a magnetic tunneling junction (MTJ) element positioned between a first electrode and a second electrode;
a multiferroic material in contact with a ferromagnetic storage material of the MTJ element; and
an access device coupled to the MTJ element;
wherein the access device includes a first gate electrode and a second gate electrode; and
wherein at least one of the first gate electrode and the second gate electrode is configured to provide an electric field to the multiferroic material responsive to a voltage applied between the first electrode and at least one of the first gate electrode and the second gate electrode.

9. The memory cell of claim 8, wherein the multiferroic material includes a first portion coupled between the first gate electrode and the ferromagnetic storage material.

10. The memory cell of claim 9, wherein the multiferroic material includes a second portion coupled between the second gate electrode and the ferromagnetic storage material.

11. The memory cell of claim 9, wherein the first portion of the multiferroic material is configured to be a gate oxide material associated with the access device.

12. The memory cell of claim 9, wherein the first portion of the multiferroic material is located above a gate oxide material associated with the access device.

13. The memory cell of claim 8, wherein the multiferroic material includes:
a first portion coupled to a first edge portion of the ferromagnetic storage material; and
a second portion coupled to a second edge portion of the ferromagnetic storage material.

14. The memory cell of claim 8, wherein the tunneling barrier material is magnesium oxide (MgO).

15. A method of operating a spin torque transfer (STT) memory cell, the method comprising:
altering a magnetization of a free ferromagnetic storage material of a magnetic tunneling junction (MTJ) element of the STT memory cell by providing an electric field to a multiferroic material in contact with the ferromagnetic storage material;
wherein the MTJ element includes:
a pinned ferromagnetic material;
an antiferromagnetic material; and
a tunneling barrier material positioned between the ferromagnetic storage material and the pinned ferromagnetic material;
wherein the STT memory cell includes a bottom electrode, a top electrode, a first additional electrode, and a second additional electrode; and
wherein providing the electric field to the multiferroic material includes applying a voltage difference between the first and the second additional electrodes, wherein the first and second additional electrodes are gate electrodes of a vertical, access device associated with the STT memory cell.

16. The method of claim 15, wherein altering the magnetization of the free ferromagnetic material includes switching a magnetization direction from a first configuration to a second configuration.

17. The method of claim 15, including switching the magnetization direction from at least one of:
a configuration parallel to a magnetization direction of the pinned ferromagnetic material to a magnetization direction antiparallel to the magnetization direction of the pinned ferromagnetic material; and
a configuration antiparallel to the magnetization direction of the pinned ferromagnetic material to a magnetization direction parallel to the magnetization direction of the pinned ferromagnetic material.

18. The method of claim 15, including determining a state of the STT memory cell induced by the electric field provided to the multiferroic material.

19. The method of claim 15, including subsequently providing a programming current through the MTJ element.

20. The method of claim 15, wherein providing the electric field to the multiferroic material includes applying a voltage difference between the top electrode and the bottom electrode of the STT memory cell.

21. The method of claim 15, wherein providing the electric field to the multiferroic material includes applying a voltage difference between at least one of the top electrode and bottom electrode and at least one of the at least one additional electrode.

22. The method of claim 15, wherein providing the electric field to the multiferroic material includes providing an electric field having a magnitude sufficient to:
induce a change in antiferromagnetic ordering of the multiferroic material; and
provide antiferromagnetic exchange coupling between the multiferroic material and the ferromagnetic storage material.

23. The method of claim 15, wherein a first portion of the multiferroic material is configured to be a gate oxide material associated with an access device associated with the STT memory cell.

24. A spin torque transfer memory cell structure, comprising:
a tunneling barrier material positioned between a ferromagnetic storage material and a pinned ferromagnetic material in contact with an antiferromagnetic material;

a multiferroic material in contact with the ferromagnetic storage material;
wherein the antiferromagnetic material, the ferromagnetic storage material, and the pinned ferromagnetic material are located between a first electrode and a second electrode;
  a third electrode and a fourth electrode configured to provide an electric field to the multiferroic material responsive to a voltage applied between the third electrode and the fourth electrode; and
  wherein at least one of the third electrode and the fourth electrode is gate of a vertical access device coupled to the spin torque transfer memory cell structure.

25. The memory cell structure of claim 24, wherein the at least one of the third and the fourth electrode is in contact with the multiferroic material.

26. A spin torque transfer memory cell, comprising:
a magnetic tunneling junction (MTJ) element positioned between a first electrode and a second electrode;
a multiferroic material in contact with a ferromagnetic storage material of the MTJ element; and
an access device coupled to the MTJ element;
wherein the access device includes a first gate electrode and a second gate electrode;
wherein the multiferroic material includes a first portion coupled between the first gate electrode and the ferromagnetic storage material; and
wherein the first portion of the multiferroic material is configured to be a gate oxide material associated with the access device.

* * * * *

UNITED STATES PATENT AND TRADEMARK OFFICE
CERTIFICATE OF CORRECTION

PATENT NO. : 8,358,534 B2
APPLICATION NO. : 12/885012
DATED : January 22, 2013
INVENTOR(S) : Stephen J. Kramer et al.

It is certified that error appears in the above-identified patent and that said Letters Patent is hereby corrected as shown below:

In column 11, lines 28-29, in Claim 6, delete "multiferrioc" and insert -- multiferroic --, therefor.

Signed and Sealed this
Ninth Day of April, 2013

Teresa Stanek Rea
*Acting Director of the United States Patent and Trademark Office*